United States Patent [19]

Hoeltge

[11] Patent Number: 5,378,913
[45] Date of Patent: Jan. 3, 1995

[54] MOS TRANSISTOR HAVING THREE GATE ELECTRODES

[75] Inventor: Harald Hoeltge, Munich, Germany

[73] Assignee: Siemens Aktiengesellschaft, Munich, Germany

[21] Appl. No.: 119,704

[22] Filed: Sep. 10, 1993

[30] Foreign Application Priority Data

Sep. 10, 1992 [EP] European Pat. Off. ........ 92115516.4

[51] Int. Cl.$^6$ ..................... H01L 29/76; H01L 29/94
[52] U.S. Cl. .................................. 257/365; 257/364; 257/366; 257/401
[58] Field of Search .............. 257/364, 365, 366, 401

[56] References Cited

FOREIGN PATENT DOCUMENTS

| 0309748 | 4/1989 | European Pat. Off. ............ 257/365 |
| 0330142 | 8/1989 | European Pat. Off. ............ 257/280 |
| 2855844 | 6/1980 | Germany ............................. 257/365 |
| 158597  | 1/1983 | Germany ............................. 257/365 |

OTHER PUBLICATIONS

IBM Technical Disclosure Bulletin, vol. 16, No. 5, Oct. 1973, "Bidirectional, high voltage, MOSFET's" by Fang et al., pp. 1653–1654.

Primary Examiner—Steven Ho Yin Loke
Attorney, Agent, or Firm—Hill, Steadman & Simpson

[57] ABSTRACT

An MOS transistor has a source region, a drain region, first gate electrode with a first channel zone allocated to it, second gate electrodes having a second channel zone allocated to it, and a third gate electrode with a corresponding third channel zone. The second channel zone is more highly doped than the base material in which the MOS transistor is formed, while the third channel zone is more lightly doped than the second channel zone. The second and third gate electrodes are conductively connected so that higher drain voltages are accommodated at high-frequencies while avoiding tunnel punch-through.

4 Claims, 1 Drawing Sheet

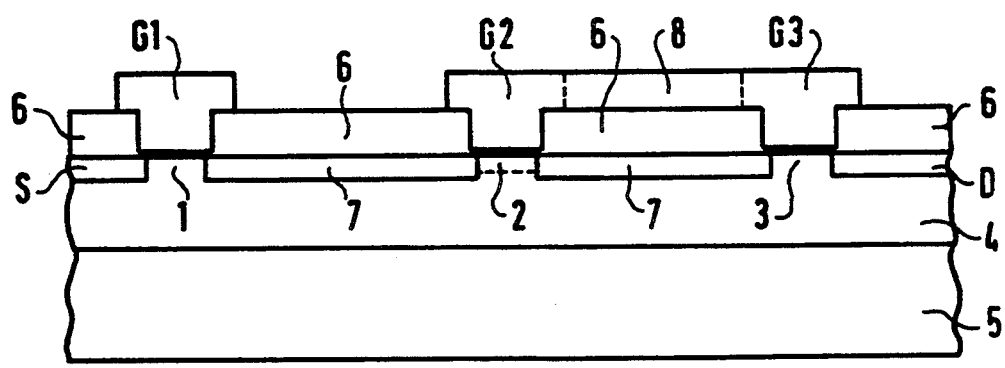

MOS TRANSISTOR HAVING THREE GATE ELECTRODES

BACKGROUND OF THE INVENTION

1. Field of the Invention

The present invention relates generally to an MOS transistor, and in particular to an MOS transistor having gate electrodes arranged at corresponding channel zones.

2. Description of the Related Art

MOS field effect transistors which have two gate electrodes are known and are commonly referred to as MOS tetrodes. MOS tetrodes are distinguished by good high-frequency properties and they are often used in, for example, pre-stages of television tuners where the supply voltage typically is approximately 12 volts.

It is desired in the pre-stages of television tuners that the integrated drain current be stabilized. Integrated circuits (IC) are typically provided for this purpose, wherein the main constituent of the circuit is an MOS tetrode. It is desired that the integrated circuits operate at the voltages which are available in traditional television tuners. It is required as a secondary condition, for example, that the second gate control voltages which range from approximately one volt to eight volts for the tetrode be available in television tuners. A prerequisite for the use of such a component is the availability of the relatively high second gate cutoff voltage. To achieve a high second gate cutoff voltage, a doping concentration at the, for example, p-conductive second gate channel zone must be higher than that of the base material which is, for example, p-doped silicon. This high doping concentration is achieved by appropriate boron implantation, for example.

Tunnel punch-through occurs at relatively low drain voltages at the pn-junction of the tetrode when relatively high p and n concentrations lie under a gate electrode insulated only by a thin gate oxide layer, such as under a second gate electrode neighboring the drain electrode. For example, an MOS tetrode can only work given drain voltages up to nine volts with a second gate cutoff voltage higher than one volt, in the known MOS tetrode. Such a component should be usable at drain voltages of up to 13 volts, however, as is present in, for example, television tuners.

SUMMARY OF THE INVENTION

It is an object of the present invention to overcome the disadvantages of MOS transistors described above and to provide an MOS transistor which, while avoiding tunnel punch-through, may be used at drain voltages up to 13 volts, while still retaining its good high-frequency properties.

This and other objects and advantages of the invention are achieved by an MOS transistor having a source region, a drain region, a first gate electrode which is arranged therebetween and which has a first channel zone adjacent thereto, a second gate electrode having a second channel zone adjacent thereto with a doping concentration which is higher than that of the base material, and a third gate electrode having a third channel zone provided between the second gate electrode and a drain region. The third channel zone is more lightly doped than the highly doped second channel zone. The second gate electrode is electrically conductively connected to the third gate electrode.

Further advantages and developments are provided in the foregoing MOS transistor when the third channel zone has the same doping concentration as the base material. In a preferred embodiment, the base material is p-doped silicon. It is desirable that the length of the second channel zone be shortened relative to the known MOS transistor tetrode by the length of the third channel zone. Additionally, the length of the first channel zone may be shorter than the length of the second channel zone and the third channel zone given an equally high doping of the first and second channel zones.

The advantages realized by the present device are that the interpositioning of a third gate electrode ensures that the highly doped zone of the drain region does not come into contact with the highly doped channel zone under the second gate electrode. This increases the tunnel punch-through voltage so that tunnel punch-through, or tunnel breakdown, is avoided even at relatively high drain voltages. The present device has high frequency properties which are as good as those exhibited by traditional MOS tetrodes.

The present device, due to the addition of the third gate, may be referred to as a pentode.

BRIEF DESCRIPTION OF THE DRAWINGS

The single FIGURE in the present application is a cross section through an MOS transistor according to the principles of the present invention.

DETAILED DESCRIPTION OF THE PREFERRED EMBODIMENTS

An MOS transistor is shown in section in the single drawing Figure and includes a semiconductor substrate 5 which is, preferably, silicon. A p-doped layer 4, which is preferably boron-doped silicon, is epitaxially applied onto the silicon substrate 5 to provide a base material for the active region. The individual components of the MOS transistor are arranged in the surface of the base material 4.

The manufacturing process by which the MOS transistor is formed uses fairly conventional process steps which, according to the present invention, are carried out as follows: a phosphorus-doped silicon oxide 6 layer is applied on top of the base material 4. Gate windows are etched into the phosphorus-doped silicon oxide 6 at locations where three gate electrodes G1, G2 and G3 are later to be applied. The gate oxidation under the gate windows where the gate electrodes G1, G2 and G3 are to be later applied is performed in a temperature step, which simultaneously causes drive-in, or diffusion, of phosphorus from the phosphorus-doped silicon oxide 6 to form the source region S, the drain region D and the n-conductive, highly doped n+-intermediate regions 7 between the later formed gate electrodes G1 and G2 as well as between the latter applied gate electrodes G2 and G3. Contact windows (which lie laterally outside the scope of the drawings, and are therefore not shown) are then etched for the source region S and the drain region D at either end of the illustrated transistor. Finally, aluminum is deposited and shaped to form the electrodes G1, G2, G3, in the gate windows as well as in the contact windows for the source and drain regions.

A second channel zone 2 under the second gate electrode G2 which is more highly p-doped than the base material 4 is provided. In the Figure, the highly p-doped channel zone 2 is indicated by a broken line. The higher p-doping of the base material at the second channel zone 2 is achieved by boron implantation. A third gate electrode G3 having a third channel zone 3 is provided between the second gate electrode G2 and the drain region D. The channel zone 3 which lies under the third gate electrode G3 is more lightly doped than the highly doped channel zone 2 under the second gate electrode G2. The third channel zone 3 preferably has the same doping concentration as the base material 4 which, as previously mentioned, is composed of p-doped silicon.

An electrically conductive connection 8 connecting the second gate electrode G2 and the third gate electrode G3 is provided. The connection 8 is of metal and extends between the two gate electrodes as shown in the Figure and is delineated from the two electrodes G2 and G3 by broken lines.

In the preferred embodiment, the length of the second channel zone 2 is shortened by the length of the third channel zone 3 in comparison to the known MOS transistors. The lengths of the second channel zone 2 and the third channel zone 3 are preferably half as large as the length of the second channel zone in traditional tetrodes, which helps to guarantee equally good high-frequency properties. The effect of the insertion of the third gate electrode G3 is to provide a noticeably smaller reactance capacitance between the first gate electrode G1 and drain region D in comparison to traditional MCS tetrodes.

When the first channel zone 1 is as highly boron-doped as the second channel zone 2, then the length of the first channel zone together with the second channel zone 2 may be reduced in size. The length of the first channel zone may be shorter than the length of the second channel zone and the third channel zone given an equally high doping of the first and second channel zones. The first channel zone may be of a length in the sub-micron range. This provides a considerable improvement to the high-frequency properties of the components.

Thus, there is shown and described an MOS transistor having a source region, a drain region, and first, second and third gate electrodes wherein the first gate electrode has a corresponding first channel zone and the second gate electrode has a corresponding second channel zone which has a higher doping concentration than the base material. The third gate electrode has a corresponding third channel zone which is more lightly doped than the highly doped second channel zone and is arranged between the second gate electrode and the drain region. The third gate electrode is electrically conductively connected to the second gate electrode.

Although other modifications and changes may be suggested by those skilled in the art, it is the intention of the inventor to embody within the patent warranted hereon all changes and modifications as reasonably and properly come within the scope of his contribution to the art.

I claim:

1. A MOS transistor, comprising:
   a base of including a layer of semiconductor material of a predetermined doping concentration;
   a source region on said base;
   a drain region on said base;
   a first gate electrode on said base between said source region and said drain region;
   a first channel zone in said base adjacent said first gate electrode;
   a second gate electrode on said base;
   a second channel zone in said base adjacent said second gate electrode, said second channel zone having a doping concentration higher than said predetermined doping concentration of said layer of said base;
   a third gate electrode on said base between said second gate electrode and said drain region, said third gate electrode being electrically connected to said second gate electrode; and
   a third channel zone in said base adjacent said third gate electrode, said third channel zone being more lightly doped than said second channel zone.

2. A MOS transistor as claimed in claim 1, wherein said third channel zone has a substantially identical doping concentration as said predetermined doping concentration of said layer of said base.

3. A MOS transistor as claimed in claim 1, wherein said base consists essentially of p-doped silicon.

4. A MOS transistor as claimed in claim 1, wherein said first and second channel zones are of a substantially equal doping level, and wherein said second channel zone and said third channel zone are of a length greater than that of said first channel zone.

* * * * *